(12) United States Patent
Vispute

(10) Patent No.: US 7,859,906 B1
(45) Date of Patent: Dec. 28, 2010

(54) CIRCUIT AND METHOD TO INCREASE READ MARGIN IN NON-VOLATILE MEMORIES USING A DIFFERENTIAL SENSING CIRCUIT

(75) Inventor: Hemant Vispute, Bangalore (IN)

(73) Assignee: Cypress Semiconductor Corporation, San Jose, CA (US)

( * ) Notice: Subject to any disclaimer, the term of this patent is extended or adjusted under 35 U.S.C. 154(b) by 95 days.

(21) Appl. No.: 12/059,560

(22) Filed: Mar. 31, 2008

Related U.S. Application Data

(60) Provisional application No. 60/909,362, filed on Mar. 30, 2007.

(51) Int. Cl.
*G11C 16/28* (2006.01)

(52) U.S. Cl. ............ 365/185.21; 365/189.15; 365/189.07; 365/189.09; 365/207; 365/210.1; 365/185.2

(58) Field of Classification Search ............ 365/189.15, 365/189.07, 189.09, 207, 210.1, 185.2, 185.21
See application file for complete search history.

(56) References Cited

U.S. PATENT DOCUMENTS

| | | |
|---|---|---|
| 3,636,530 A | 1/1972 | Mark et al. |
| 3,676,717 A | 7/1972 | Lockwood |
| 3,811,076 A | 5/1974 | Smith |
| 3,846,768 A | 11/1974 | Krick |
| 3,906,464 A | 9/1975 | Lattin |
| 3,950,737 A | 4/1976 | Uchida et al. |
| 4,000,413 A | 12/1976 | Wong et al. |
| 4,044,343 A | 8/1977 | Uchida |
| 4,051,388 A | 9/1977 | Inukai |
| 4,095,281 A | 6/1978 | Denes |
| 4,096,584 A | 6/1978 | Owen, III et al. |
| 4,103,344 A | 7/1978 | Fagan et al. |
| 4,110,639 A | 8/1978 | Redwine |
| 4,112,507 A | 9/1978 | White et al. |
| 4,128,773 A | 12/1978 | Troutman et al. |

(Continued)

FOREIGN PATENT DOCUMENTS

JP      6136994 A1      7/1998

(Continued)

OTHER PUBLICATIONS

USPTO Notice of Allowance for U.S. Appl. No. 11/415,694 dated May 6, 2008; 4 pages.

(Continued)

*Primary Examiner*—Hoai V Ho
*Assistant Examiner*—Jay Radke

(57) ABSTRACT

A differential sensing circuit and method for enhancing read margin of a memory device are disclosed. The differential sensing circuit includes a first current-to-voltage converter. The circuit includes a first current subtraction circuit having an erase reference cell. A first input terminal of the first current-to-voltage converter is coupled to the first current subtraction circuit. The circuit includes a second current-to-voltage converter. The circuit also includes a second current subtraction circuit having a program reference cell. A first input terminal of the second current-to-voltage converter is coupled to the second current subtraction circuit. Both the first and second current subtraction circuits are coupled to a memory access bias signal. Outputs of the first and second current-to-voltage converters are compared to generate an enhanced read margin output.

18 Claims, 6 Drawing Sheets

U.S. PATENT DOCUMENTS

| | | |
|---|---|---|
| 4,138,737 A | 2/1979 | McCann |
| 4,146,802 A | 3/1979 | Moench |
| 4,149,099 A | 4/1979 | Nagami |
| 4,216,395 A | 8/1980 | Beecham et al. |
| 4,262,219 A | 4/1981 | Richard |
| 4,271,487 A | 6/1981 | Craycraft et al. |
| 4,291,242 A | 9/1981 | Schriber |
| 4,342,101 A | 7/1982 | Edwards |
| 4,347,448 A | 8/1982 | Plachno |
| 4,354,255 A | 10/1982 | Stewart |
| 4,433,252 A | 2/1984 | Lewis |
| 4,435,786 A | 3/1984 | Tickle |
| 4,472,643 A | 9/1984 | Furuyama |
| 4,510,584 A | 4/1985 | Dias et al. |
| 4,538,246 A | 8/1985 | Wang et al. |
| 4,638,465 A | 1/1987 | Rosini et al. |
| 4,701,858 A | 10/1987 | Stokes et al. |
| 4,716,552 A | 12/1987 | Maltiel et al. |
| 4,769,787 A | 9/1988 | Furusawa et al. |
| 4,858,185 A | 8/1989 | Kowshik et al. |
| 4,878,203 A | 10/1989 | Arakawa |
| 5,029,132 A | 7/1991 | Arakawa |
| 5,065,362 A | 11/1991 | Herdt et al. |
| 5,097,449 A | 3/1992 | Cuevas |
| 5,111,257 A | 5/1992 | Andoh et al. |
| 5,168,334 A | 12/1992 | Mitchell et al. |
| 5,283,764 A | 2/1994 | Kim et al. |
| 5,287,319 A | 2/1994 | Fukumoto |
| 5,315,177 A | 5/1994 | Zagar et al. |
| 5,353,248 A | 10/1994 | Gupta |
| 5,365,475 A | 11/1994 | Matsumura et al. |
| 5,387,534 A | 2/1995 | Prall |
| 5,424,569 A | 6/1995 | Prall |
| 5,426,605 A | 6/1995 | Van Berkel et al. |
| 5,436,480 A | 7/1995 | Yu |
| 5,467,300 A | 11/1995 | Komarek et al. |
| 5,485,429 A | 1/1996 | Ono |
| 5,496,756 A | 3/1996 | Sharma et al. |
| 5,506,816 A | 4/1996 | Hirose et al. |
| 5,510,638 A | 4/1996 | Lancaster et al. |
| 5,511,020 A | 4/1996 | Hu et al. |
| 5,517,448 A | 5/1996 | Liu |
| 5,523,971 A | 6/1996 | Rao |
| 5,602,776 A | 2/1997 | Herdt et al. |
| 5,617,357 A | 4/1997 | Haddad et al. |
| 5,621,696 A | 4/1997 | Dhong et al. |
| 5,644,533 A | 7/1997 | Lancaster et al. |
| 5,648,930 A | 7/1997 | Randazzo |
| 5,656,837 A | 8/1997 | Lancaster et al. |
| 5,677,866 A | 10/1997 | Kinoshita |
| 5,734,617 A | 3/1998 | Zheng |
| 5,760,644 A | 6/1998 | Lancaster et al. |
| 5,774,397 A | 6/1998 | Endoh et al. |
| 5,774,400 A | 6/1998 | Lancaster et al. |
| 5,789,776 A | 8/1998 | Lancaster et al. |
| 5,793,684 A | 8/1998 | Yach |
| 5,812,477 A | 9/1998 | Casper |
| 5,875,144 A | 2/1999 | Zheng |
| 5,892,712 A | 4/1999 | Hirose |
| 5,978,298 A | 11/1999 | Zheng |
| 5,986,932 A | 11/1999 | Ratnakumar et al. |
| 5,999,447 A | 12/1999 | Naura et al. |
| 6,011,742 A | 1/2000 | Zheng |
| 6,016,264 A | 1/2000 | Lin |
| 6,026,018 A | 2/2000 | Herdt |
| 6,084,814 A | 7/2000 | Casper et al. |
| 6,097,618 A | 8/2000 | Jenne |
| 6,122,191 A | 9/2000 | Hirose et al. |
| 6,141,247 A | 10/2000 | Roohparvar et al. |
| 6,172,907 B1 | 1/2001 | Jenne |
| 6,181,627 B1 | 1/2001 | Casper et al. |
| 6,297,103 B1 | 10/2001 | Ahn et al. |
| 6,363,011 B1 | 3/2002 | Hirose et al. |
| 6,420,925 B1 | 7/2002 | Fifield et al. |
| 6,489,930 B2 | 12/2002 | Murray |
| 6,490,203 B1 | 12/2002 | Tang |
| 6,553,556 B1 | 4/2003 | Blodgett |
| 6,556,487 B1 | 4/2003 | Ratnakumar et al. |
| 6,574,145 B2 | 6/2003 | Kleveland et al. |
| 6,617,914 B1 | 9/2003 | Kothandaraman |
| 6,621,324 B2 | 9/2003 | Fifield et al. |
| 6,625,080 B2 | 9/2003 | Casper et al. |
| 6,633,506 B2 | 10/2003 | Casper et al. |
| 6,741,117 B2 | 5/2004 | Lee |
| 6,759,895 B2 | 7/2004 | Takami |
| 6,781,916 B2 | 8/2004 | McClure |
| 7,031,189 B2 | 4/2006 | Pascucci |
| 7,146,585 B2 | 12/2006 | Blodgett |
| 7,149,114 B2 | 12/2006 | Taheri et al. |
| 7,426,142 B1 * | 9/2008 | Stansell et al. ......... 365/185.21 |
| 2002/0057604 A1 * | 5/2002 | Khouri et al. ............... 365/200 |

FOREIGN PATENT DOCUMENTS

| | | |
|---|---|---|
| WO | WO 95/30244 A1 | 11/1995 |
| WO | WO 97/15929 A1 | 5/1997 |

OTHER PUBLICATIONS

USPTO Non-Final Rejection for U.S. Appl. No. 11/415,694 dated Nov. 1, 2007; 9 pages.

USPTO Notice of Allowance for U.S. Appl. No. 10/803,011 dated Aug. 3, 2006; 7 pages.

USPTO Final Rejection or U.S. Appl. No. 10/803,011 dated May 30, 2006; 13 pages.

USPTO Non-Final Rejection for U.S. Appl. No. 10/803,011 dated Dec. 9, 2005, 13 pages.

USPTO Miscellaneous Action for U.S. Appl. No. 10/803,011 dated Mar. 18, 2005; 1 page.

International Search Report of the International Searching Authority for International Application No. PCT/US2005/008154 mailed Jul. 1, 2005; 2 pages.

Written Opinion of the International Searching Authority for International Application No. PCT/US2005/008154 received Jun. 29, 2005, 5 pages.

USPTO Notice of Allowance for U.S. Appl. No. 08/549,483 dated Aug. 8, 1996; 3 pages.

USPTO Non-Final Rejection for U.S. Appl. No. 08/549,483 dated May 29, 1996; 5 pages.

USPTO Notice of Allowance for U.S. Appl. No. 08/846,558 dated Jul. 20, 1998; 3 pages.

USPTO Requirement Restriction for U.S. Appl. No. 09/136,694 dated Aug. 17, 1999; 4 pages.

Frohman-Bentchkowsky, "The Methal-Nitrice-Oxide-Silicon (MNOS) Transistor - Characteristics and Applications," Proceedings of the IEEE, vol. 58, No. 8, Aug. 1970, pp. 1207-1219; 13 pages.

Donaldson et al , "SNOS 1K X 8 Static Nonvolatile RAM," IEEE Journal of Solid-State Circuits, vol. SC-17, No. 5, Oct. 1982, pp. 847-851, 5 pages.

Hirose et al., "Non-Volatile Latch for FPGA Devices," NVX Corporation, Jan. 10, 1995; 6 pages.

Hirose et al., "Non-Volatile Latch Description," NVX Corporation, Nov. 1, 1995; 23 pages.

Hirose et al., "Non-Volatile Latch for Semiconductor Devices," NVX Corporation, Sep. 8, 1994; 13 pages.

USPTO Notice of Allowance for U.S. Appl. No. 09/871,172 dated Dec. 13, 2002; 4 pages.

USPTO Non-Final Rejection for U.S. Appl. No. 09/871,172 dated Jul. 22, 2002; 6 pages.

USPTO Notice of Allowance for U.S. Appl. No. 08/885,156 dated Dec. 16, 1998; 1 page.

USPTO Non-Final Rejection for U.S. Appl. No. 08/885,156 dated Aug. 27, 1998; 3 pages.

USPTO Notice of Allowance for U.S. Appl. No. 09/426,100 dated Jul. 19, 2000; 4 pages.

USPTO Non-Final Rejection for U.S. Appl. No. 09/426,100 dated Mar. 10, 2000; 7 pages.

USPTO Notice of Allowance for U.S. Appl. No. 09/136,694 dated Apr. 24, 2000; 4 pages.

USPTO Non-Final Rejection for U.S. Appl. No. 09/136,694 dated Nov. 12, 1999; 8 pages.

USPTO Notice of Allowance for U.S. Appl. No. 09/626,267 dated Aug. 7, 2001; 5 pages.

USPTO Non-Final Rejection for U.S. Appl. No. 09/626,267 dated Mar. 28, 2001; 5 pages.

USPTO Requirement for Restriction/Election for U.S. Appl. No. 09/626,267 dated Dec. 1, 2000; 4 pages.

USPTO Notice of Allowance for U.S. Appl. No. 09/137,914 dated Oct. 29, 1999; 1 page.

USPTO Non-Final Rejection for U.S. Appl. No. 09/137,914 dated Jun. 9, 1999; 4 pages.

"nvSRAM Basics," Simtek 1999 Data Book, Chapter 8; 8-1 through 8-5; 5 pages.

USPTO Notice of Allowance for U.S. Appl. No. 07/361,033 dated Apr. 30, 1991; 4 pages.

USPTO Final Rejection for U.S. Appl. No. 07/361,033 dated Jan. 18, 1991; 5 pages.

USPTO Non-Final Rejection for U.S. Appl. No. 07/361,033 dated Jun. 12, 1990; 11 pages.

USPTO Notice of Allowance for U.S. Appl. No. 08/234,288 dated Oct. 2, 1995; 1 page.

USPTO Final Rejection for U.S. Appl. No. 08/234,288 dated May 31, 1995; 3 pages.

USPTO Non-Final Rejection for U.S. Appl. No. 08/234,288 dated Oct. 6, 1994; 2 pages.

USPTO Notice of Allowance for U.S. Appl. No. 08/715,569 dated Aug. 19, 1997; 1 page.

USPTO Notice of Allowance for U.S. Appl. No. 08/735,973 dated Nov. 21, 1997; 3 pages.

Svensson et al., "Trap-Assisted Charge Injection in MNOS Structures," Oct. 1973, J. Appl. Phys., vol. 44, No. 10; 7 pages.

Lundstrom et al., "Properties of MNOS Structures," Jun. 1972, IEEE Transaction on Electron Devices, vol. Ed-19, No. 6; 11 pages.

Takahashi et al., "Estimation of Insulation Layer Conductrance in MNOS Structure," Nov. 1993, IEEE Transactions on Electron Devices, vol. 40, No. 11; 5 pages.

USPTO Notice of Allowance for U.S. Appl. No. 08/988,942 dated Jan. 3, 2000; 2 pages.

USPTO Non-Final Rejection for U.S. Appl. No. 08/988,942 dated Oct. 15, 1999; 5 pages.

USPTO Non-Final Rejection for U.S. Appl. No. 08/988,942 dated Apr. 29, 1999; 4 pages.

USPTO Requirement for Restriction/Election for U.S. Appl. No. 08/988,942 dated Feb. 8, 1999; 3 pages.

USPTO Non-Final Rejection for U.S. Appl. No. 08/926,611 dated Jul. 7, 1998; 5 pages.

USPTO Notice of Allowance for U.S. Appl. No. 08/926,611 dated Dec. 14, 1998; 3 pages.

Herdt et al., "A 256K Nonvolatile Static RAM," Simtek Corporation, No. 5.3, 1995, pp. 1-4; 4 pages.

Ohnakado et al., "Novel Electron Injection Method Using Band-to-Band Tunneling Induced Hot Electron (BBHE) for Flash Memory with a P-Channel Cell," IEDM 95-279, 1995, pp. 11.5.1-11.5.4; 4 pages.

Betty Prince, "Semiconductor Memories; A Handbook of Design, Manufacture and Application," Second Edition, Texas Instruments, John Wiley & Sons, 1983, pp. 611-620; 11 pages.

* cited by examiner

US 7,859,906 B1

CIRCUIT AND METHOD TO INCREASE READ MARGIN IN NON-VOLATILE MEMORIES USING A DIFFERENTIAL SENSING CIRCUIT

This application claims priority under 35 U.S.C. § 119(e) to U.S. Provisional Application No. 60/909,362, filed on Mar. 30, 2007, the entire contents of which are hereby incorporated by reference herein.

BACKGROUND

1. Field of the Invention

The present invention relates to memory architectures. More particularly, the present invention relates to a circuit and method to increase the read margin in non-volatile memories (NVMs) by using a differential sensing scheme.

2. Background Information

Conventionally, a programmable non-volatile memory (NVM) device is useful in many applications, because they retain programmed information even if power is subsequently isolated from the memory device. Like other types of electronic memories, programmable NVMs are usually constructed as an array of bit cells, with each bit cells storing one bit of information. Unlike other memory types, the bit cells used in many programmable NVMs permit electric charge to be injected into a storage node during programming, with the injected charge remaining in the storage node until the bit cell is erased. For example, if the charge stored in the storage node is of a negative type (e.g., electrons), then the particular cell is called a program cell. If the charge stored in the storage node is of a positive type (e.g., holes), then the particular cell is called an erase cell.

One type of a conventional programmable NVM is a flash memory, which uses a floating-gate bit cell structure. Floating-gate bit cells are transistors that incorporate both a control gate and a floating gate. The control gate is used to properly bias the transistor for reading, programming or erasing data, and the floating gate is used as the storage node for the bit cell. By storing different amounts and types of charge in the floating gate, the amount of voltage needed to bias the transistor into a conduction state, commonly referred to as the voltage threshold (Vt), is altered. It is the voltage threshold of the transistor that determines whether the bit cell represents a 1 to 0.

The floating-gate structure has at least two known limitations. First, floating-gate bit cells require relatively long program and erase times compared to other bit cell types. Second, the voltages needed to inject charge into a floating-gate bit cell require transistors with relatively thick oxide layers. Another undesirable characteristic of floating-gate memories is that a large number of process steps are needed to fabricate floating-gate bit cells. To overcome some of the limitations of floating-gate memories, other NVM architectures have been developed. NVM architecture using silicon-Oxygen-Nitrogen-Oxygen-Silicon (SONOS) memories provide advanced operational features over floating-gate structures. The advantages of simplicity, scalability, thinner tunnel oxide, reduced electric-fields and directly coupled gate voltages are some of the advanced features of NVM architectures using SONOS memories. However, SONOS memories generally exhibit problems related to leakage of stored charge during memory read operations, commonly referred to as "read disturb" properties.

FIG. 1 illustrates a conventional single-ended SONOS memory array circuit 100 using a conventional sensing configuration for a memory read mode operation. The sensing configuration includes two stacks, one having memory cells referred to as matrix cell/SONOS cell 101 and the other having a reference current 102. The matrix cell 101 is part of the memory array and is located in the memory core. The reference current 102 is not part of the memory core and is placed near the sense amplifier (e.g., out of the memory array). In the read mode, the accessed SONOS cell pass gate is connected to a power supply Vpwr, while the un-accessed cell in the memory array pass gate is at ground. The reference current 102 is generated in such a way that its value is approximately half-way between the program cell current (Ipgm) and the erase cell current (Iers). The reference current 102 is compared against the accessed SONOS cell current to determine whether it is a program cell or erase cell.

Referring again to FIG. 1, the left stack includes a memory cell with its Bit line BL connected to a column decoder transistor N11 (107) whose gate is connected to column access transistor gate signal (Col). After passing through the column decoder transistor N11 (107), the bit line BL is connected to a source of a transistor N21 (106) whose gate is connected to a fixed biasing signal (Bias). The drain of transistor N21 (106) is connected to a load resistor RL1 (104). The transistor N21 (106) essentially forms a common gate amplifier with bit line BL as input signal and output taken at the node Vpgm/Vers. The right stack comprises the reference current 102 in the bottom of the stack. The bit line BL of reference current stack goes through a column decoder transistor N12 (108), and is connected to the input of a common gate amplifier transistor N22 (107) at its source terminal. The drain of transistor N22 (017) is connected to the load resistor RL2 (105) (which could be, for example, a current mirror load or MOS diode connected. load). The output of the right stack is taken at node Vref. Signals from the nodes Vpgm/Vers and Vref are compared using a comparator circuit 103.

To illustrate the circuit operation in empirical form for correctly sensing the erased and programmed states of matrix cell 101, considering a first case, wherein Vpgm/Vers=Vpgm when reading programmed cell, and a second case, wherein Vpgm/Vers=Vers when reading erase cell. The ideal condition would be Vref=(Vers+Vpgm)/2 for comparing the program cell accessed voltage Vpgm or erased cell accessed voltage Vers through the comparator 103. The read margin is defined as the voltage differential developed at the input of the comparator 103 when performing the read operation. The program read margin is defined as Vpgm−Vref, for example, the voltage differential developed at the input of comparator 103 while accessing the program matrix cell. The erase read margin is defined as Vers−Vref, for example, the voltage differential developed at the input of comparator 103 while accessing the erase matrix cell. Under the above condition, Vref>Vers with a comparator output (OUT)=1, when the erase matrix cell is accessed, and Vref<Vpgm with the comparator output (OUT)=0, when program matrix cell is accessed. The resistors RL1 (104) and RL2 (105) (or, for example, a current mirror load/MOS diode connected transistor load) are sized in accordance with the above condition. Therefore, the conventional sense margin during program and erase cell access is read margin=(Iers-Ipgm)/2, assuming an ideal Iref=(Iers+Ipgm)/2 (see, e.g., FIG. 4).

There are numerous limitations of the conventional memory array circuit 100. For example, the sense margin is limited to (Iers-Ipgm)/2, given an ideal reference current Iref takes a predetermined value, as in Iref=(Iers+Ipgm)/2. Thus, there is a loss of read margin either for reading logic 1 or logic 0. The reference current Iref needs to be adjusted after chip manufacturing to center its value between the program (Ipgm) and erase (Iers) cell current, thereby increasing the test time and creating a need for additional circuit area. In addition, the program/erase cycling of memory cells deteriorates the cell characteristics (known as oxide rupture), thereby changing the memory cell current and causing Iref≠(Iers+Ipgm)/2, and resulting in incorrect reads (due to the program or erase cell read margin loss). Furthermore, the charge stored in the floating gate of flash cells leaks as function of time, thereby drifting the ideal program/erase current of flash cells, and causing Iref≠(Iers+Ipgm)/2. Such a situation results in incorrect reads (due to either program or erase cell read margin loss).

Another limitation of the conventional memory circuits is that to get the double read margin it is required to store both data in the matrix cell (e.g., data "1" is stored as "Erase-Program" cell pair in order, whereas data "0" is stored as "Program-Erase" cell pair in order). However, doubling the read margin in such a manner requires a double area penalty, as at least two memory cells are required to store both data bits.

SUMMARY OF THE INVENTION

A circuit and method for enhancing read margin in non-volatile memories are disclosed. In accordance with exemplary embodiments, according to a first aspect of the present invention, a differential sensing circuit includes a first current-to-voltage converter. The circuit includes a first current circuit having an erase reference cell. A first input terminal of the first current-to-voltage converter is coupled to the first current subtraction circuit. The circuit includes a second current-to-voltage converter. The circuit also includes a second current subtraction circuit having a program reference cell. A first input terminal of the second current-to-voltage converter is coupled to the second current subtraction circuit. Both the first and second current subtraction circuits are coupled to a memory access bias signal. Outputs of the first and second current-to-voltage converters are compared to generated an enhanced read margin output.

According to the first aspect, each of the first current subtraction circuit having an erase reference cell and the second current subtraction circuit having a program reference cell can comprise a plurality of series configured transistor devices. The plurality of series configured transistor devices can include a first transistor coupled to the memory access bias signal at a gate terminal, a second transistor coupled to a fixed biasing signal at a gate terminal, and a third Silicon-Oxygen-Nitrogen-Oxygen-Silicon (SONOS) transistor device coupled to a power supply signal at a gate terminal. Each current-to-voltage converter can be coupled to the memory access bias signal at a respective second input terminal. Each current-to-voltage converter can comprise an operational amplifier coupled to a feedback resistor. Both the erase reference cell and the program reference cell can comprise SONOS cells placed along with a plurality of matrix memory cells in the same array. Both the SONOS cells and the plurality of matrix memory cells can be arranged in an array to undergo memory program and erase operations. The memory access bias signal can be generated through a bias transistor of a matrix memory cell. The matrix memory cell can comprise a series configuration of transistors, further including a diode-connected P-channel Metal Oxide Semiconductor (PMOS) bias transistor for generating the memory access bias signal, a first N-channel Metal Oxide Semiconductor (NMOS) transistor having a gate terminal coupled to a fixed biasing signal, a second NMOS transistor having a gate terminal coupled to a column access signal, and a SONOS transistor having a gate terminal coupled to a power supply signal.

According to a second aspect of the present invention, a memory device with an enhanced read margin includes a first current subtraction stack having an erase reference cell coupled to a first current-to-voltage converter. The memory device includes a second current subtraction stack having a program reference cell coupled to a second current-to-voltage converter. The memory device includes a matrix cell stack coupled to both the first and second current subtraction stacks and coupled to provide a memory access bias signal. Output terminals of both the first and second current-to-voltage converters are coupled to a comparator circuit for generating an enhanced read margin output.

According to the second aspect, each of the first current subtraction stack having an erase reference cell and the second current subtraction stack having a program reference cell can comprise a PMOS transistor having a gate terminal coupled to the memory access bias signal, a NMOS transistor having a gate terminal coupled to a fixed biasing signal, wherein the NMOS transistor can be configured as a common gate amplifier and a bit line voltage limiter, and a SONOS transistor device having a gate terminal coupled to a power supply signal. The matrix cell stack can include a diode-connected bias transistor for generating the memory access bias signal, a first transistor having a gate terminal coupled to a fixed biasing signal, a second transistor having a gate terminal coupled to a column access signal, and a SONOS transistor having a gate terminal coupled to a power supply signal.

According to a third aspect of the present invention, a method for improving read margin of a memory device includes steps of: generating a memory access bias signal; generating an erase current in response to the memory access bias signal; mirroring the erase current through an erase reference cell stack; mirroring the erase current through a program reference cell stack; generating a program current in response to the memory access bias signal; mirroring a program current through a program reference cell stack; and mirroring the program current through the erase reference cell stack.

According to the third aspect, each of the steps of mirroring the erase current through a program reference cell stack and mirroring the program current through the erase reference cell stack can include the steps of: generating a first differential current through the erase reference cell stack; and generating a second differential current through the program reference cell stack. A read margin output is proportional to a difference between an erase reference cell stack current and a program reference cell stack current. The method can include the step of arranging the program reference cell stack, the erase reference cell stack and a plurality of matrix memory cells in a scalable common memory array. The program reference cell stack, the erase reference cell stack and the plurality of matrix memory cells are arranged to minimize process and geometric mismatches.

According to a fourth aspect of the present invention, a method for enhancing read margin of a memory device includes the steps of: subtracting a first current component from a second current component to generate a first differential current; wherein the first differential current is generated in accordance with an erase reference operation of the memory device; subtracting a third current component from a fourth current component to generate a second differential current; wherein the second differential current is generated in accordance with a program reference operation of the memory device; generating a first voltage component substantially proportional to the first differential current corresponding to a memory access bias signal; generating a second voltage component substantially proportional to the second differential current corresponding to the memory access bias signal; and comparing the first and second voltage components to generate an enhanced read margin output.

According to the fourth aspect, one of the first voltage component and the second voltage component is proportional to a difference between an erase current component and a program current component.

BRIEF DESCRIPTION OF THE DRAWINGS

Other objects and advantages of the present invention will become apparent to those skilled in the art upon reading the following detailed description of preferred embodiments, in conjunction with the accompanying drawings, wherein like reference numerals have been used to designate like elements, and wherein.

DETAILED DESCRIPTION OF THE PREFERRED EMBODIMENTS

Exemplary embodiments of the present invention are directed to an improved circuit and method for enhancing the read margin of a memory device. According to an exemplary embodiment of the invention, a differential sensing circuit includes a first current-to-voltage converter. The circuit includes a first current subtraction circuit having an erase reference cell. A first input terminal of the first current-to-voltage converter is coupled to the first current subtraction circuit. The circuit includes a second current-to-voltage converter. The circuit also includes a second current subtraction circuit having a program reference cell. A first input terminal of the second current-to-voltage converter is coupled to the second current subtraction circuit. Both the first and second current subtraction circuits are coupled to a memory access bias signal (e.g., Pbias). Outputs of the first and second current-to-voltage converters are compared (e.g., using a comparator) to generate an enhanced read margin output.

Figure 1:
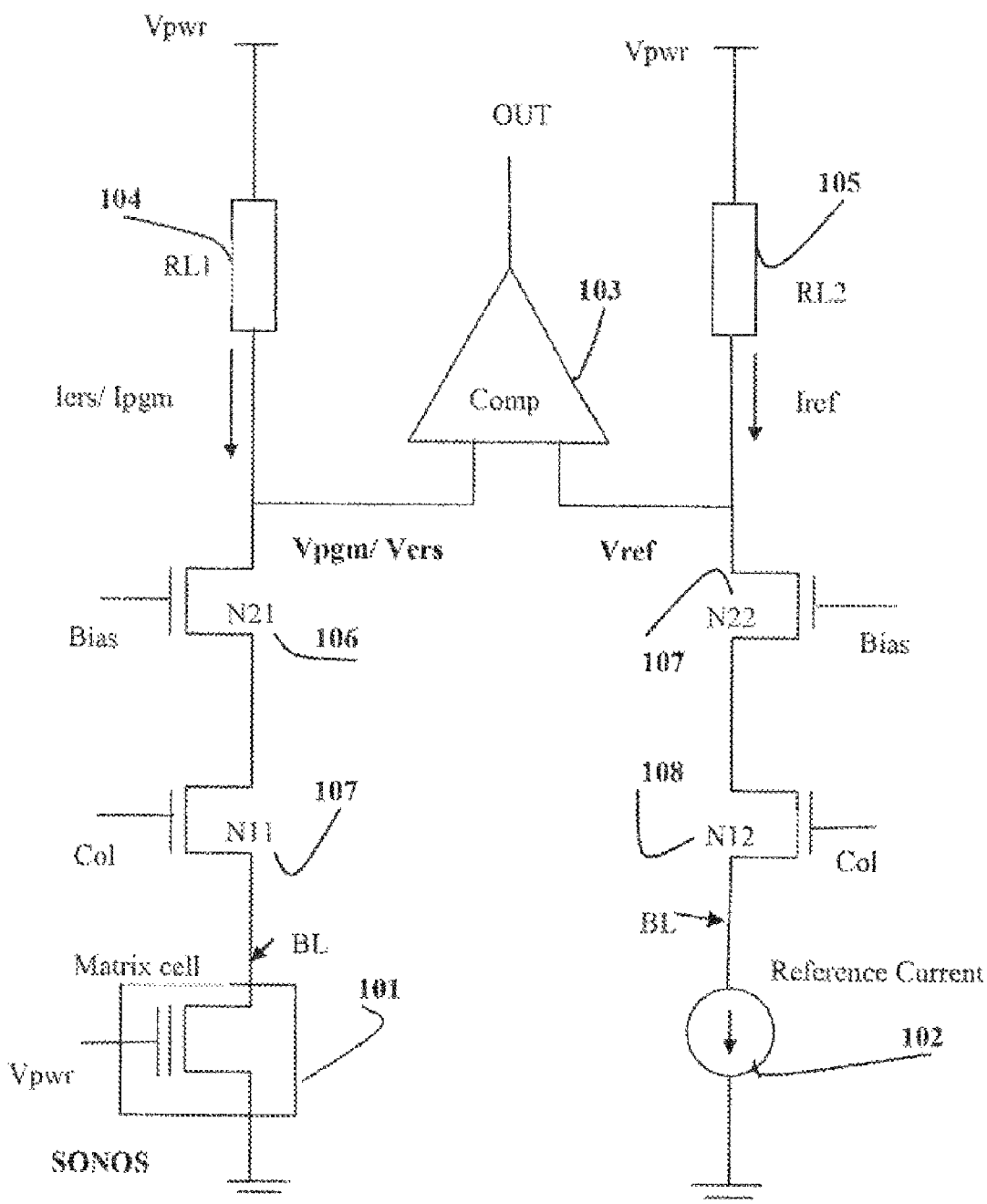
FIG. 1 illustrates a circuit diagram depicting a Prior Art memory technology using SONOS memory array or a flash memory array during read mode.
Figure 2:
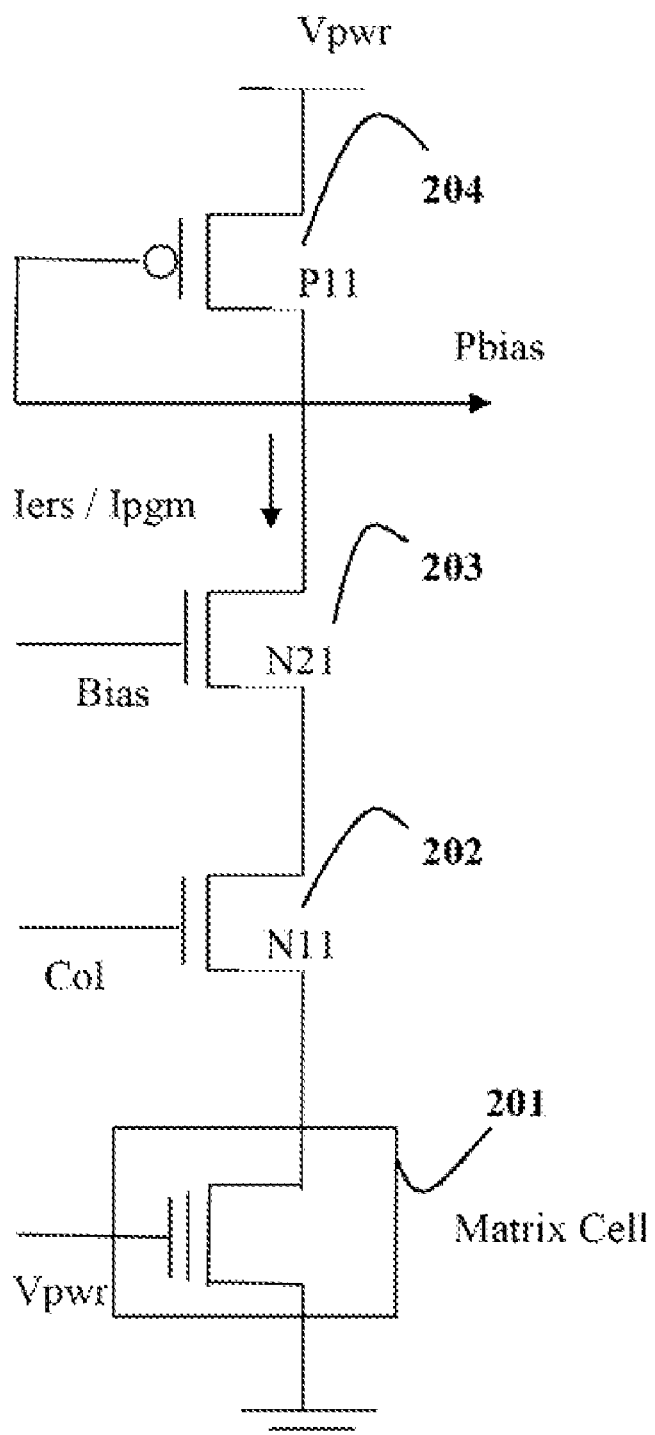
FIG. 2 illustrates a circuit diagram depicting an accessed matrix cell stack, according to an exemplary embodiment of the present invention.

These and other aspects of the present invention will now be described in greater detail. According to exemplary embodiments, the improved circuit for enhancing read margin of an non-voltage memory cell comprises two reference cells arranged in two separate stacks and commonly coupled by a comparator. The two reference cells can comprise, for example, Silicon-Oxygen-Nitrogen-Oxygen-Silicon (SONOS) cells or the like, and are designated as program cells and erase cells. FIG. 2 illustrates an exemplary embodiment of the invention depicting improved stack circuit 200. The stack circuit 200 includes a matrix cell 201 coupled to a first transistor N11 (202). The first transistor (202) is coupled to a second transistor N21 (203). The second transistor N21 (203) is coupled to, for example, a diode-connected P-type Metal Oxide Semiconductor (PMOS) device P11 (204). The matrix cell 201 is accessed by enabling the gate of the matrix cell 201 and the PMOS device P11 (204) with a suitable power supply voltage Vpwr (e.g., 1.8 volts or other suitable voltage). Current developed in the stack of matrix cell 201 (e.g., an erase current) is then compared against other reference cells (as illustrated in and discussed with reference to FIG. 3) using a signal bias voltage (Pbias) generated through the gate of the PMOS device P11 (204). According to an exemplary embodiment, if the accessed matrix cell 201 is a program cell, then Pbias voltage generated by PMOS device P11 (204) corresponds to program cell current Ipgm. However, if the accessed matrix cell 201 is an erase cell, then the Pbias voltage generated by PMOS device P11 (204) corresponds to erase cell current Iers. The Pbias signal generated by PMOS device P11 (204) is used for mirroring such a stack current into reference cell stack in FIG. 3.

Figure 3:
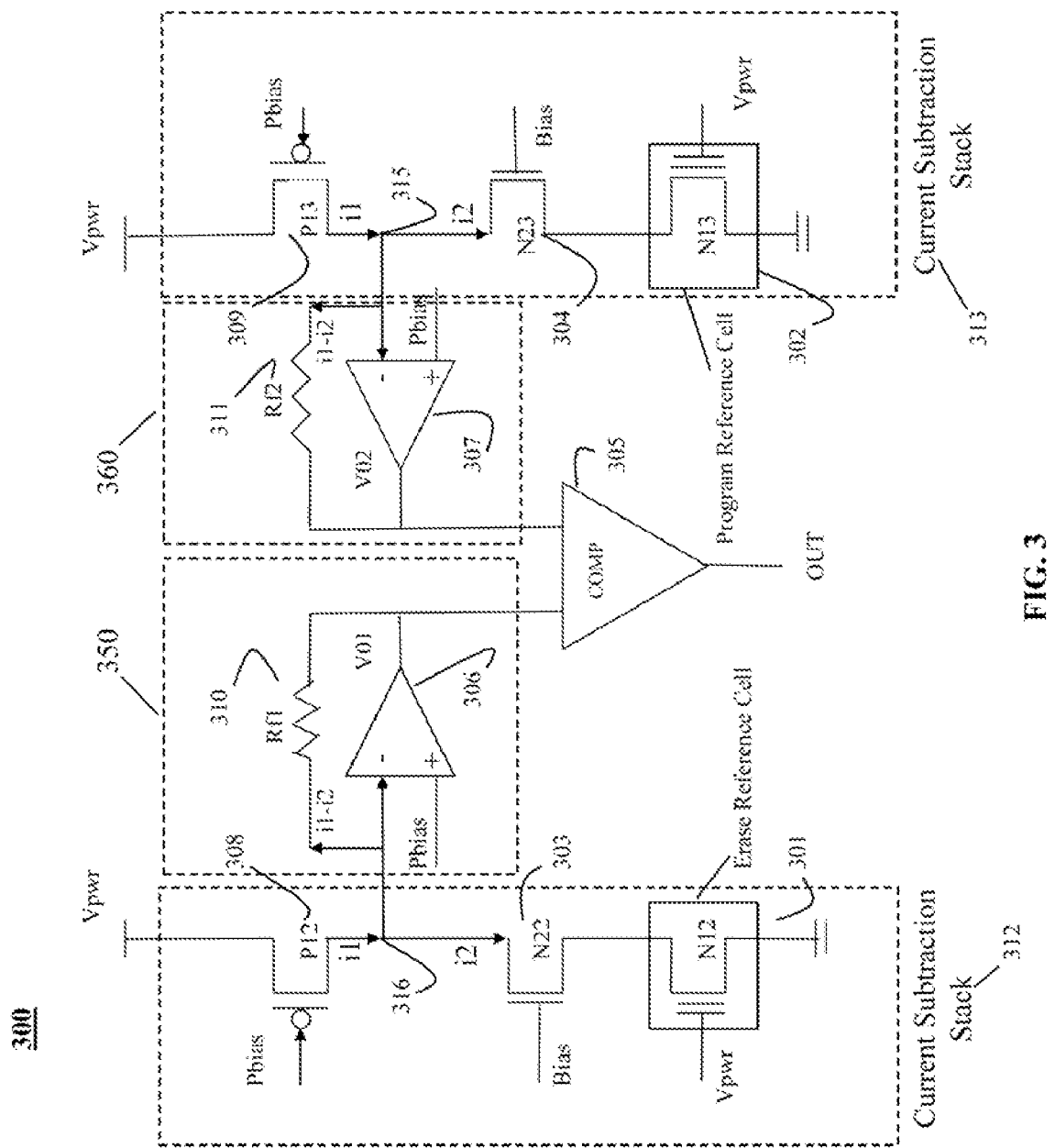
FIG. 3 illustrates a circuit diagram depicting a matrix cell current mirrored and compared against reference cell current, according to an exemplary embodiment of the present invention.

FIG. 3 illustrates a circuit diagram depicting a matrix cell current mirrored and compared against a reference cell current, according to an exemplary embodiment of the present invention. More particularly, FIG. 3 illustrates a two stack circuit setup comprising a reference cell in each stack. The reference cell in each of the current subtraction stacks can comprise, for example, a SONOS cell or any other suitable type of cell, and is placed in the array along with the matrix cells. The current subtraction stack 312 comprises an erase reference cell 301 coupled to a first transistor N22 (303) and a first PMOS device P12 (308). The current subtraction stack 312 is enabled by a suitable power supply voltage Vpwr (e.g., an internally regulated power supply), which is fed to the gate of the erase reference cell 301 and a source of the first PMOS device P12 (308). The gate of the first PMOS device P12 (308) is connected to an appropriate input signal bias voltage (Pbias) while the matrix cell 201 (shown in FIG. 2) is accessed. A suitable fixed bias voltage (Bias) is fed to the gate of the first transistor N22 (303). A current-to-voltage converter circuit 350 comprises, for example, an operational amplifier (OPAMP) 306 and a feedback resistor Rf1 (310). A negative input terminal of OPAMP 306 is coupled to a common node 316 formed by the coupling of the drain of the first PMOS device P12 (308) and the drain of the first transistor N22 (303). The first OPAMP 306 positive input is connected to the input signal bias voltage (Pbias) generated by stack circuit 200 (illustrated in FIG. 2). The OPAMP 306 output voltage V01 is fed as an input to a comparator device 305.

The current subtraction stack 313 comprises a program reference cell 302 coupled to a second transistor N23 (304) and a second PMOS device P13 (309). The current subtraction stack 313 is enabled by a suitable power supply voltage Vpwr (e.g., internally regulated according to an exemplary embodiment of the invention), which is fed via the gate of the program reference cell 302 and the source of the second PMOS device P13 (309). The gate of the second PMOS device P13 (309) is connected to bias voltage (Pbias) that is generated while accessing the matrix cell 201 (see FIG. 2). Further, the gate of the second transistor N23 (304) is enabled by the fixed bias voltage (Bias). A current-to-voltage converter circuit 360 comprises, for example, an OPAMP 307 and a feedback resistor Rf2 (311). A negative input terminal of OPAMP 307 is coupled to common node 315 formed by the coupling of the drain of the second PMOS device P13 (309) and drain of the second transistor N23 (304). The OPAMP 307 positive input terminal is connected to the input signal bias voltage (Pbias) generated while accessing matrix cell 201 (see FIG. 2). The OPAMP 307 output voltage V02 is fed as another input to the comparator device 305.

The circuit operation according to exemplary embodiments of the present invention can be categorized in two stages. The first stage operation can comprise when the erase reference cell 301 is accessed, and the second stage operation can comprise when the program reference cell 302 is accessed. Referring to FIG. 3 and considering the first stage, the accessed matrix cell 201 can be an erase cell, thereby generating a Pbias signal by the PMOS device P11 (204), which is fed to the gate of first PMOS device P12 (308). The current (Iers) generated in the stack circuit 200 is mirrored in the current subtraction stack 312 by mirroring first PMOS device P12 (308). The erase reference cell 301 further sinks the same amount of current, resulting in a zero net current flowing through the feedback resistor Rf1 310. Further, since the OPAMP 306 maintains the Pbias voltage at common node 316 and the current through feedback resistor Rf1 310 is zero, the output (V01) of the OPAMP 306 equals the positive input terminal bias signal voltage (Pbias). The mirroring through the first PMOS device P12 (308) and the second PMOS device P13 (309) matches very closely to the current through PMOS device P11 (204), since the drain-to-source voltage for all of these devices is equal to Pbias due to the negative feedback action of OPAMPs 306 and 307.

In the current subtraction stack 313, the program reference cell 302 does not sink the current supplied by the second PMOS device P13 (309). The current sourced by the second PMOS device P13 (309) is Iers (since the accessed matrix cell is an erase cell), which is generally, for example, 10 times higher than the current sinking capability of the program reference cell 302 (the current sink capability of program reference cell 302 is Ipgm, since it is the current generated by a program reference cell that is generally 10 times less than Iers). The current (Iers) forced by the second PMOS device P13 (309) flows through the second feedback resistor Rf2 311. Therefore, the output (V02) of the OPAMP 307 is expressed by the following equation: input bias signal voltage (Pbias)−(erase current (Iers)*value of second feedback resistor 311) (e.g., the expression can be formulated as V02=Pbias−Iers*Rf). Therefore, both OPAMPs 306 and 307 produce two distinct states for erase matrix cell access: Pbias and Pbias−(Iers*Rf). For an erase matrix cell access, the output equations for the circuit 300 can be summarized as follows:

$V10=Pbias\ V02=Pbias-(|i1-i2|)*Rf2=Pbias-(Iers-Ipgm)*Rf2$ such that $V02\ \alpha(Iers-Ipgm)$.

Referring again to FIG. 3 and considering accessed matrix cell 201 as a program cell, the Pbias signal generated by the PMOS device P11 (204) corresponds to program cell current Ipgm. The current Ipgm is generated in the stack circuit 200 that is mirrored and sourced by the PMOS device P12 (308) using the Pbias signal. The current Ipgm is much less as compared to the current sink capability (e.g., Ipgm=0 μA, Iers=10 μA for 130 nm gate length technology) of the erase reference cell 301. Hence, the net current flow through the feedback resistor is the difference between the erase current and program current (Iers−Ipgm), and is fed to the erase reference cell 301 via the output of the OPAMP 306. The output of the OPAMP 306 is the V01=Pbias+Iers*Rf1 (assuming current sourced by first PMOS device P12 (308) is zero). Further, in the current subtraction stack 313, the reference cell is a program reference cell. The current Ipgm sourced by the second PMOS device P13 (309) is substantially the same as that of the current sink capability (e.g., Ipgm=0 μA and Iers=10 μA for 130 nm gate length technology) of the program reference cell 302. The net current flow through the feedback resistor Rf2 311 is zero, and output (V02) of the OPAMP 307 is be V02=Pbias. Therefore, both of the OPAMPS 306 and 307 produce two distinct states for program matrix cell access, the first state being V01=Pbias+(Iers*Rf1) and the other state being V02=Pbias. For a program matrix cell access, the output equations for the circuit 300 can be summarized as follows:

$V01=Pbias+(i1-i2)*Rf1=Pbias+(Iers-Ipgm)*Rf1$ such that $V01\alpha(Iers-Ipgm)$.

In both the stages illustrated above for the program and erase matrix cell accesses, the output of one of the OPAMPs is directly proportional to the difference between the erase reference cell 301 current and the program reference cell 302 current. Therefore, the read margin available for both the program and erase reference cell access according to exemplary embodiments of the present invention is (Iers−Ipgm), as compared to (Iers−Ipgm)/2 available in conventional sensing technologies. The above stages are alternatively summarized in the Table 1:

TABLE 1

| MATRIX CELL STATE | V01 | V02 | VOUT |
| --- | --- | --- | --- |
| Erase Cell | Pbias | Pbias − (Iers * Rf) | 0 |
| Program Cell | Pbias + (Iers * Rf) | Pbias | 1 |

Figure 4:
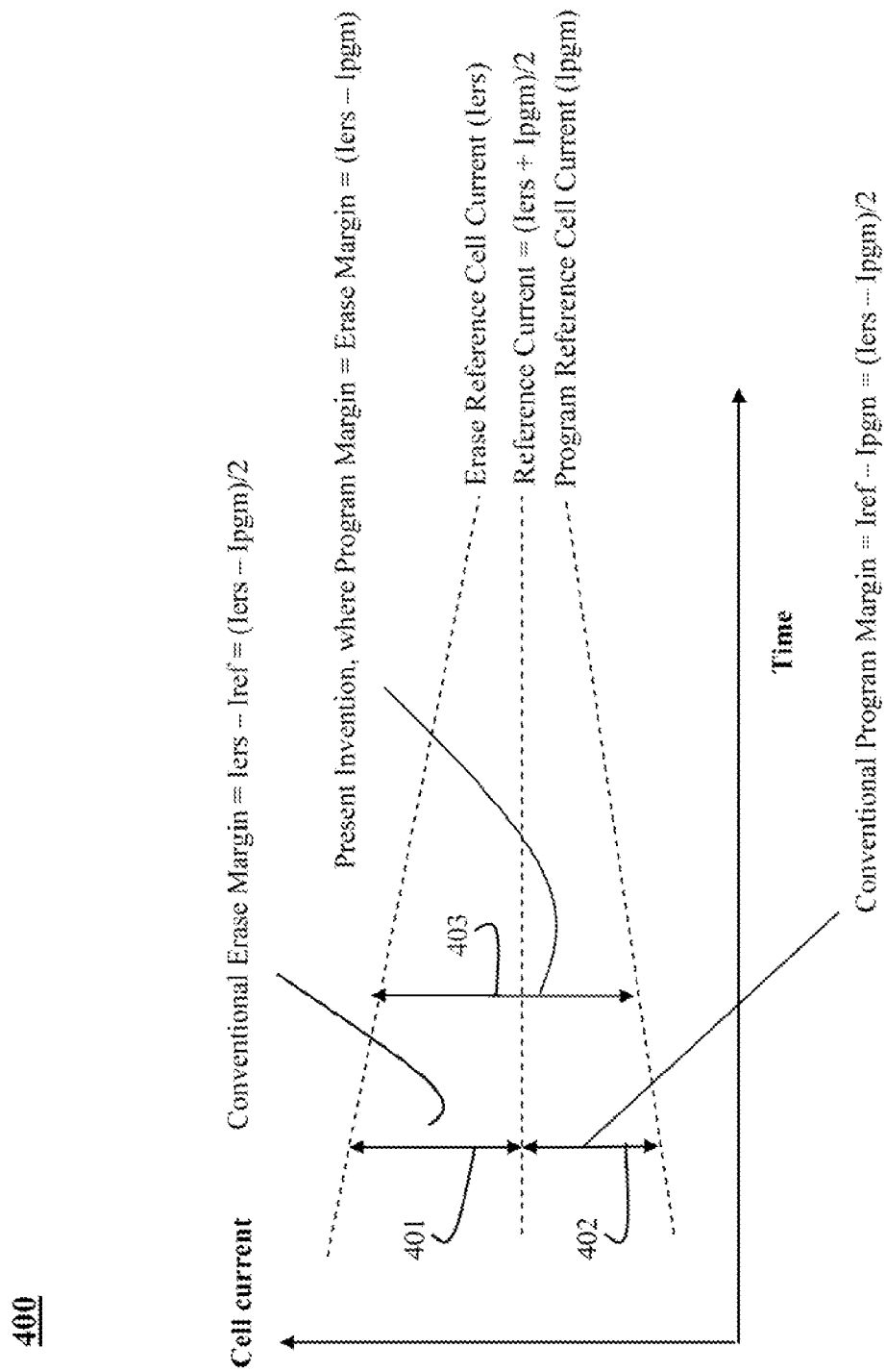
FIG. 4 illustrates a graphical representation depicting the read margin doubled, according to an embodiment of the present invention.

FIG. 4 illustrates an exemplary graphical representation 400 of the read margin achieved by the present invention when compared to conventional schemes, in accordance with an exemplary embodiment of the invention. The conventional schemes for achieving erase and program margins achieved are designated as 401 (where the conventional erase margin=Iers−Iref=(Iers−Ipgm)/2) and 402 (where the conventional program margin=Iref−Ipgm=(Iers−Ipgm)/2, respectively. The enhanced read margin achieved by the present invention is designated as 403 (where program margin=erase margin=(Iers−Ipgm)). Graph 400 illustrates that the read margin provided by exemplary embodiments of the present invention is double that of the read margin offered by conventional schemes. To closely match the reference cell and the matrix cell, the reference cells are placed in the matrix cell array and undergo the same program and erase operation as that of the matrix cell. Such a scheme helps to reduce the spatial, process and geometric mismatches between the matrix and reference cells, thereby closely matching the characteristics.

Figure 5:
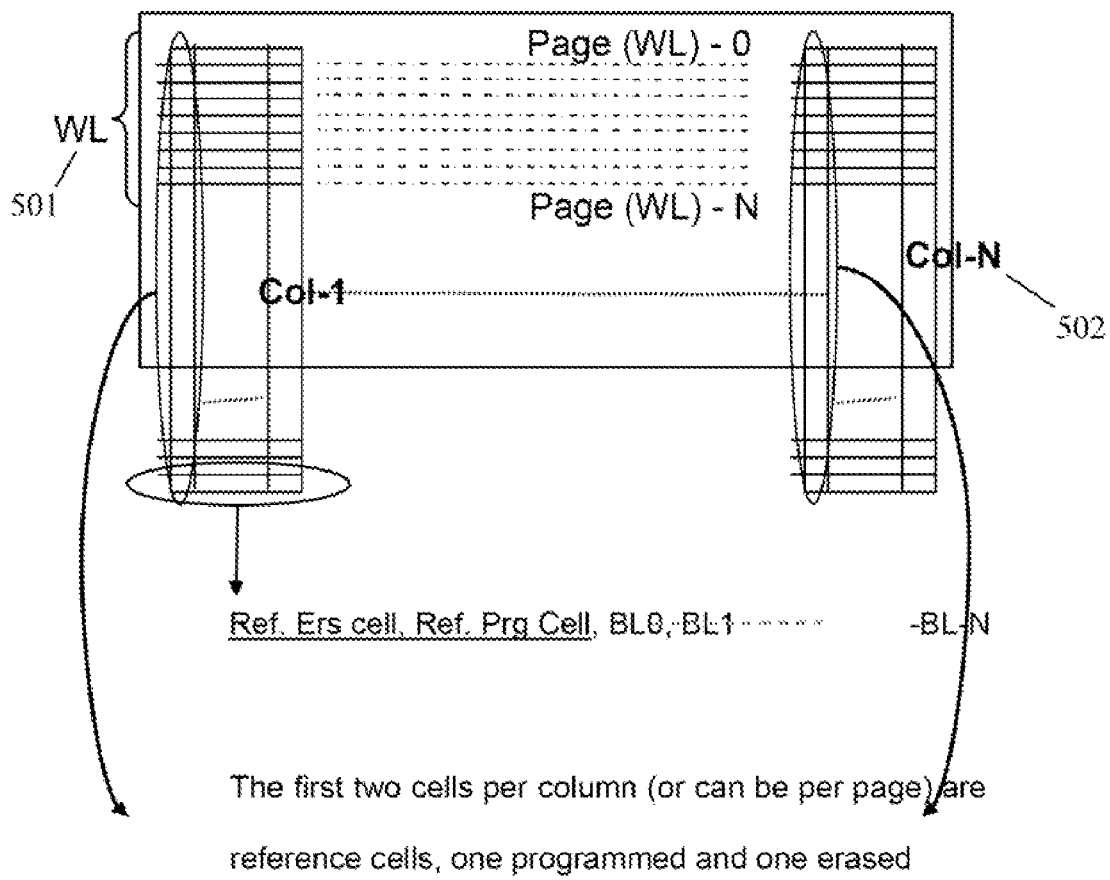
FIG. 5 illustrates a memory array architecture for a serial EEPROM memory, according to an exemplary embodiment of the present invention.

Merely for purposes of illustration and not limitation, an exemplary memory array architecture 500 for a serial embedded EPROM is illustrated in FIG. 5, in accordance with an exemplary embodiment of the present invention. The memory array 500 comprises N columns 502 and a variable number of rows 502. Each column comprises one data byte (e.g., 8 data bits and 4 ECC bits), and a reference cell (one program and one erase), and a variable number of rows. Thus, there are reference cells per byte per row. When a particular byte is accessed, the corresponding reference cell in the same column and row is used in the SONOS array read operation.

Figure 6:
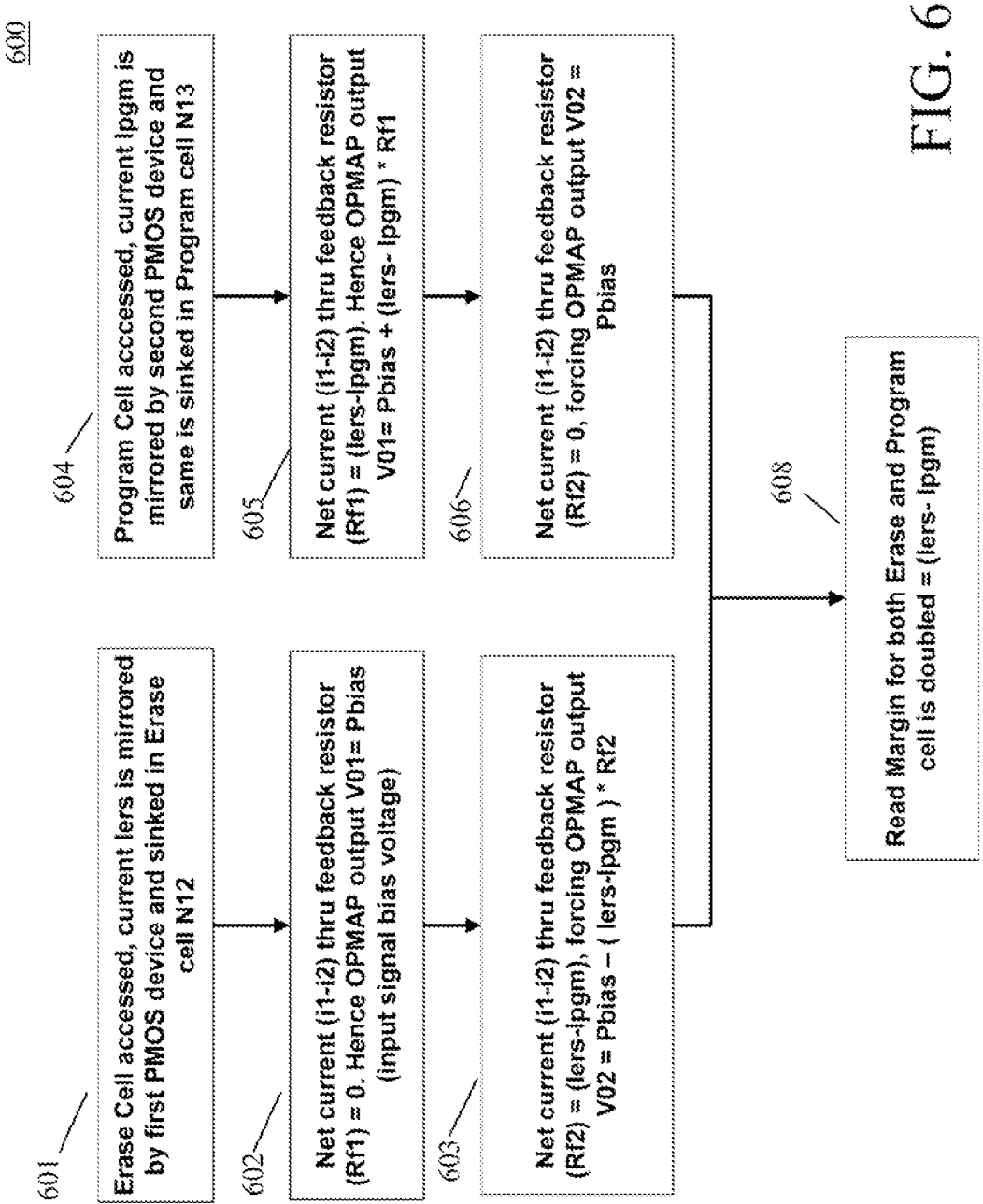
FIG. 6 illustrates a flow chart depicting the differential sensing method for a SONOS array, according to an exemplary embodiment of the present invention.

FIG. 6 illustrates an exemplary flow chart representation 600 of the method of differential sensing of memory cells, according to exemplary embodiments of the present invention. A step 601 comprises accessing the matrix erase cell. The current Iers is mirrored by the first PMOS device P12 (308) and sinked by the erase reference cell 301. A step 602 comprises a net current (i1−i2) flowing through the feedback resistor Rf1 310, where the net current is substantially zero, thereby forcing the output voltage V01 of the OPAMP 306 to equal the input signal bias voltage (Pbias). A step 603 comprises the net current (i1−i2) flowing through the feedback resistor Rf2 311, where the net current is the differential current (Iers−Ipgm), thereby forcing the output voltage V02 of the OPAMP 307 to be proportional to the differential current. In other words, V02 is proportional (Iers−Ipgm).

A step 604 comprises accessing the matrix program cell, in which the current Ipgm is mirrored by second PMOS device P13 and sinked by the program reference cell 302, having zero current flow through the feedback resistor Rf2 311. A step 605 comprises the net current (i1−i2) flowing through the feedback resistor Rf1 310, where the net current comprises the differential current (Iers−Ipgm), thereby forcing the output voltage V01 of the OPAMP 306 to be proportional to the differential current. A step 606 comprises the net current (i1−i2) flowing through the feedback resistor Rf2 311 being zero, thereby forcing the output voltage V02 of the OPAMP 307 to equal the input signal bias voltage (Pbias). A step 608 comprises doubling of the read margin of both the erase and program reference cell accesses, where, for example, read margin=(Iers−Ipgm).

An advantage of the present invention over the conventional schemes is that the read margin (for both program reference cell and erase reference cell) is doubled using a differential sensing scheme and without the need to store the complimentary bit data the memory array. With the conventional schemes, to get the double read margin, it is required to store both data bits in the matrix cell (e.g., data "1" is stored as "Erase-Program" cell pair in order, whereas data "0" is stored as "Program-Erase" cell pair in order). Doubling the read margin in such a conventional manner requires a double area penalty, since two cells are required to store each data bit. However, according to exemplary embodiments of the present invention, a double read margin is achieved without storing two bits for each data bit. Other advantages of the present invention include the improvement in the endurance specification. The improvement in the endurance specification occurs, because the reference cell undergoes the same number of erase and program cycles as that of the matrix cell, and, thus, forces it to match the matrix cell electrical characteristics, thereby improving the read margin. The present invention does not require a reference current for read operations and no tweaking is required at, for example, device sorts, thereby reducing the sort test time. In addition, any disadvantages related to reference current generation and tracking it over the time are eliminated, since exemplary embodiments of the present invention no longer requiring the reference current 102. The reference cells and matrix cells are closely matched, since they are placed in the same array, thereby reducing the process and geometric mismatches. The present inventive architecture is also scalable form one technology to the other.

Exemplary embodiments of the present invention can be used in conjunction with any suitable type of integrated circuit or memory device, such as, for example, SONOS, flash and SEEPROM (Serially EEPROM), or other non-volatile memory technologies, to enhance the read margin of the memory device while improving data retention capability of the memory device.

Embodiments of the present invention are well suited to performing various other steps or variations of the steps recited herein, and in a sequence other than that depicted and/or described herein. In one embodiment, such a process can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. As used herein, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium can include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CDROM).

Each of elements of the circuits 200 and 300 can be comprised of any suitable type of electrical or electronic circuit, component or device that is capable of performing the functions associated with the respective element. For example, any suitable type of transistor can be used for the transistor elements illustrated in FIGS. 2 and 3. Any or all of the elements of circuits 200 and 300 can be connected to one another using any suitable type of electrical connection capable of communicating electrical information. Alternatively or additionally, any or all elements of the circuits 200 and 300 can formed on, for example, a monolithic substrate. Details of the improved circuit providing an increase in the read margin output in a memory device with improved data retention and without storing any complimentary data, and the method of achieving the same, that are widely known and not relevant to the present discussion have been omitted from the present description for purposes of clarity and brevity.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment.

It will be appreciated by those of ordinary skill in the art that the present invention can be embodied in various specific forms without departing from the spirit or essential characteristics thereof. The present disclosed embodiments are considered in all respects to be illustrative and not restrictive. The scope of the invention is indicated by the appended claims, rather than the foregoing description, and all changes that come within the meaning and range of equivalence thereof are intended to be embraced.

What is claimed is:

1. A differential sensing circuit, comprising:
   a first current-to-voltage converter;
   a first current subtraction circuit having an erase reference cell,
      wherein a first input terminal of the first current-to-voltage converter is coupled to the first current subtraction circuit;
   a second current-to-voltage converter; and
   a second current subtraction circuit having a program reference cell,
      wherein a first input terminal of the second current-to-voltage converter is coupled to the second current subtraction circuit,
      wherein both the first and second current subtraction circuits are coupled to a memory access bias signal, and
      wherein outputs of the first and second current-to-voltage converts are compared to generate an enhanced read margin output.

2. The circuit of claim 1, wherein each of the first current subtraction circuit having an erase reference cell and the second current subtraction circuit having a program reference cell comprises a plurality of series configured transistor devices.

3. The circuit of claim 2, wherein the plurality of series configured transistor devices comprises:
   a first transistor coupled to the memory access bias signal at a gate terminal;
   a second transistor coupled to a fixed biasing signal at a gate terminal; and
   a third Silicon-Oxygen-Nitrogen-Oxygen-Silicon (SONOS) transistor device coupled to a power supply signal at a gate terminal.

4. The circuit of claim 1, wherein each current-to-voltage converter is coupled to the memory access bias signal at a respective second input terminal.

5. The circuit of claim 1, wherein each current-to-voltage converter comprises an operational amplifier coupled to a feedback resistor.

6. The circuit of claim 1, wherein both the erase reference cell and the program reference cell comprise Silicon-Oxygen-Nitrogen-Oxygen-Silicon (SONOS) cells placed along with a plurality of matrix memory cells in the same array, and
   wherein both the SONOS cells and the plurality of matrix memory cells are arranged in an array to undergo memory program and erase operations.

7. The circuit of claim 1, wherein the memory access bias signal is generated through a bias transistor of a matrix memory cell.

8. The circuit of claim 7, wherein the matrix memory cell comprises a series configuration of transistors, further including:
   a diode-connected P-channel Metal Oxide Semiconductor (PMOS) bias transistor for generating the memory access bias signal;
   a first N-channel Metal Oxide Semiconductor (NMOS) transistor having a gate terminal coupled to a fixed biasing signal;
   a second NMOS transistor having a gate terminal coupled to a column access signal; and
   a Silicon-Oxygen-Nitrogen-Oxygen-Silicon (SONOS) transistor having a gate terminal coupled to a power supply signal.

9. A memory device with an enhanced read margin, comprising:
   a first current subtraction stack having an erase reference cell coupled to a first current-to-voltage converter;
   a second current subtraction stack having a program reference cell coupled to a second current-to-voltage converter; and
   a matrix cell stack coupled to both the first and second current subtraction stacks and coupled to provide a memory access bias signal,
      wherein output terminals of both the first and second current-to-voltage converters are coupled to a comparator circuit for generating an enhanced read margin output.

10. The memory device of claim 9, wherein each of the first current subtraction stack having an erase reference cell and the second current subtraction stack having a program reference cell comprises:
    a P-channel Metal Oxide Semiconductor (PMOS) transistor having a gate terminal coupled to the memory access bias signal;
    a N-channel Metal Oxide Semiconductor (NMOS) transistor having a gate terminal coupled to a fixed biasing signal,
       wherein the NMOS transistor is configured as a common gate amplifier and a bit line voltage limiter; and
    a Silicon-Oxygen-Nitrogen-Silicon (SONOS) transistor device having a gate terminal coupled to a power supply signal.

11. The memory device of claim 9, wherein the matrix cell stack comprises:
    a diode-connected bias transistor for generating the memory access bias signal;
    a first transistor having a gate terminal coupled to a fixed biasing signal;
    a second transistor having a gate terminal coupled to a column access signal; and
    a SONOS transistor having a gate terminal coupled to a power supply signal.

12. A method for improving read margin of a memory device, comprising:
    generating a memory access bias signal;
    generating an erase current in response to the memory access bias signal;
    mirroring the erase current through an erase reference cell stack;
    mirroring the erase current through a program reference cell stack;
    generating a program current in response to the memory access bias signal;
    mirroring a program current through a program reference cell stack; and
    mirroring the program current through the erase reference cell stack.

13. The method of claim 12, wherein each of the steps of mirroring the erase current through a program reference cell stack and mirroring the program current through the erase reference cell stack comprises:
    generating a first differential current through the erase reference cell stack; and
    generating a second differential current through the program reference cell stack.

14. The method of claim 13, wherein a read margin output is proportional to a difference between an erase reference cell stack current and a program reference cell stack current.

15. The method of claim 12, further comprising:
arranging the program reference cell stack, the erase reference cell stack, and a plurality of matrix memory cells in a scalable common memory array.

16. The method of claim 15, wherein the program reference cell, the erase reference cell and a plurality of matrix memory cells are arranged to minimize process and geometric mismatches.

17. A method for enhancing read margin of a memory device, comprising:
subtracting a first current component from a second current component to generate a first differential current,
wherein the first differential current is generated in accordance with an erase reference operation of the memory device;
subtracting a third current component from a fourth current component to generate a second differential current,
wherein the second differential current is generated in accordance with a program reference operation of the memory device;
generating a first voltage component substantially proportional to the first differential current corresponding to a memory access bias signal;
generating a second voltage component substantially proportional to the second differential current corresponding to the memory access bias signal; and
comparing the first and second voltage components to generate an enhanced read margin output.

18. The method of claim 17, wherein one of the first voltage component and the second voltage component is proportional to a difference between an erase current component and a program current component.

* * * * *